United States Patent [19]

Kraus et al.

[11] Patent Number: 5,598,366
[45] Date of Patent: Jan. 28, 1997

[54] FERROELECTRIC NONVOLATILE RANDOM ACCESS MEMORY UTILIZING SELF-BOOTSTRAPPING PLATE LINE SEGMENT DRIVERS

[75] Inventors: William F. Kraus, Colorado Springs; Dennis R. Wilson, Black Forest, both of Colo.

[73] Assignee: Ramtron International Corporation, Colorado Springs, Colo.

[21] Appl. No.: 515,558

[22] Filed: Aug. 16, 1995

[51] Int. Cl.[6] .................................................. G11C 11/22
[52] U.S. Cl. ................................... 365/145; 365/189.11
[58] Field of Search ................................. 365/145, 117, 365/149, 189.11, 230.06

[56] References Cited

U.S. PATENT DOCUMENTS

| 4,291,393 | 9/1981 | Wilson | 365/203 |
|---|---|---|---|
| 4,397,003 | 8/1983 | Wilson et al. | 365/205 |
| 5,128,563 | 7/1992 | Hush et al. | 326/87 |
| 5,297,077 | 3/1994 | Imai et al. | 365/145 |
| 5,329,186 | 7/1994 | Hush et al. | 326/88 |
| 5,349,247 | 9/1994 | Hush et al. | 326/88 |
| 5,373,463 | 12/1994 | Jones, Jr. | 365/145 |
| 5,381,364 | 1/1995 | Chern et al. | 365/145 |
| 5,424,976 | 6/1995 | Cuppens | 365/145 |

Primary Examiner—Tan T. Nguyen
Attorney, Agent, or Firm—Peter J. Meza

[57] ABSTRACT

A ferroelectric nonvolatile random access memory array includes multiple ferroelectric memory cells arranged in rows and columns, a word line coupled to a word line input of each of the ferroelectric memory cells in a row, and a bit line coupled to a bit line input of each of the ferroelectric memory cells in a column. The array also includes multiple plate lines, each plate line being arranged into a plurality of plate line segments each coupled to a plate line input of a predetermined number of the ferroelectric memory cells in a row, and multiple NMOS plate line segment drivers coupled to each of the plate line segments for selectively driving the corresponding plate line segment to a full rail voltage. The rows of ferroelectric memory cells and the NMOS plate line segment drivers have substantially the same layout pitch. The plate line segment drivers are each coupled to a center portion of the corresponding plate line segment. Each NMOS plate line segment drivers includes a first NMOS transistor having a first current node coupled to the word line associated with the ferroelectric memory cells coupled to the plate line segment, a gate coupled to a source of supply voltage, and a second current node, and a second NMOS transistor having a first current node coupled to the plate line segment, a second current node coupled to a plate clock line, and a gate coupled to the second current node of the first NMOS transistor.

20 Claims, 6 Drawing Sheets

FERROELECTRIC NONVOLATILE RANDOM ACCESS MEMORY UTILIZING SELF-BOOTSTRAPPING PLATE LINE SEGMENT DRIVERS

BACKGROUND OF THE INVENTION

This invention relates generally to integrated circuit memories and more particularly to a ferroelectric nonvolatile random access memory.

The use of segmented plate lines is known in ferroelectric memory arrays. Segmented plate lines eliminate changes in the polarization state of memory cells coupled to inactive plate line segments, reducing fatigue and extending the useful operating life of the memory. Additionally, total power consumption of the memory array is reduced and the time required to transition a plate line segment is desirably reduced as compared to a non-segmented plate line.

Referring now to FIG. 1, a prior art memory cell array 10 having segmented plate lines includes a plurality of one transistor, one capacitor ferroelectric memory cells 24 arranged in rows and columns, a plurality of word lines labeled $WL_1$, $WL_2$, and $WL_N$, a plurality of bit lines labeled BL1 through $BL_4$, and $BL_5$ through $BL_8$, and plate line segments labeled $PL_{11}$ through $PL_{1N}$ and $PL_{21}$ through $PL_{2N}$. A row of memory cells 24 includes a word line WL and the memory cells that are coupled to that word line. For example, word line $WL_1$, and memory cells 24–24C and 24D–24G comprise a row of memory cells. The word lines $WL_1$, $WL_2$, through $WL_N$ are disposed substantially parallel to one another in one direction. A column of memory cells includes a bit line and the memory cells that are coupled to the bit line. For example, bit line $BL_4$, and memory cells 24C, 24H, through 24K comprise a column of memory cells. The bit lines $BL_1$ through $BL_4$ and $BL_5$ through $BL_8$ are disposed substantially parallel to one another, and perpendicular to the word lines. Each one transistor, one capacitor memory cell includes an N-channel access transistor and a ferroelectric capacitor. For example, memory cell 24 includes access transistor 28 and ferroelectric capacitor 30. Access transistor 28 has a first current node connected to bit line $BL_1$, a second current node, and a control or gate node connected to word line $WL_1$. Ferroelectric capacitor 30 has a first plate electrode connected to the second current node of access transistor 28, and a second plate electrode connected to plate line segment $PL_{11}$. In the one transistor, one capacitor memory cell arrangement shown in array 10 of FIG. 1, bit lines $BL_1$ through $BL_4$ and $BL_5$ through $BL_8$ are coupled to sense amplifiers (not shown in FIG. 1) for detection of the charge liberated from polling the ferroelectric memory cells 24. The sense amplifiers, in turn, are also coupled to dummy or reference cells (also not shown in FIG. 1) for establishing a reference charge level that determines whether the charge on the bit lines will be resolved into a logic one or a logic zero level. It should be noted that the entire array 10 could be reconfigured with two transistor, two capacitor ferroelectric memory cells such as memory cell 26. Each two transistor, two capacitor memory cell includes two N-channel access transistors and two ferroelectric capacitors. For example, memory cell 26 includes access transistors 28A and 28B, and ferroelectric capacitors 30A and 30B. Access transistor 28A has a first current node connected to bit line $BL_1$, a second current node, and a control or gate node connected to word line $WL_2$. Ferroelectric capacitor 30A has a first plate electrode connected to the second current node of access transistor 28A, and a second plate electrode connected to plate line segment $PL_{12}$.

Access transistor 28B has a first current node connected to bit line $BL_2$, a second current node, and a control or gate node connected to word line $WL_2$. Ferroelectric capacitor 30B has a first plate electrode connected to the second current node of access transistor 28B, and a second plate electrode connected to plate line segment $PL_{12}$. In the two transistor, two capacitor array configuration, bit lines BL1 through BL4 and BL5 through BL8 are coupled to sense amplifiers (not shown in FIG. 1), without the use of dummy or reference cells. The sense amplifiers resolve a valid logic state by comparing the charge on the two bit lines coupled to the memory cell, e.g. $BL_1$ and $BL_2$.

A plate line segment is coupled to a predetermined number of memory cells. In FIG. 1, four memory cells are shown coupled to each plate line segment. However, the number of memory cells coupled to a plate line segment is not significant, and may be different in other embodiments depending on the size of the array, data organization, etc. Each plate line segment is coupled to a drive line by a single NMOS coupling transistor. For example, coupling transistor 12 has a first current node connected to plate clock line $PLCLK_1$, a second current node connected to plate line segment $PL_{11}$, and a control or gate node connected to word line $WL_1$. Memory cells 24–24C are coupled to plate line segment $PL_{11}$. Coupling transistors 14 and 16 provide the plate line drive signal for plate line segments $PL_{12}$ and $PL_{1N}$, respectively. Similarly, coupling transistors 18, 20, and 22 provide the plate line drive signal for plate line segments $PL_{21}$, $PL_{22}$, and $PL_{2N}$, respectively. Representative memory cells 24D–24G are coupled to plate line segment $PL_{21}$.

In the segmented plate line array embodiment of FIG. 1 it is important to note that the voltage of the plate line signal for each of the plate line segments is equal to approximately the voltage of the plate line clock signal PLCLK (typically the power supply voltage, Vdd, of either 5 volts or 3.3 volts) minus a threshold voltage (VTN) drop across the corresponding NMOS drive transistors 12–22. For optimum performance at any operating voltage, it is desirable that the full PLCLK voltage be applied to the ferroelectric memory cells coupled to the plate line segments. It is even more important to apply the full PLCLK voltage to the plate line segments at low operating voltages. For reliable low power supply voltage operations, for example 3.3 volts, it is necessary to completely eliminate the $V_{TN}$ drop presented by coupling transistors 12–22.

Previous designs for eliminating or reducing the $V_{TN}$ drop of the coupling transistor have involved the use of P-channel transistors, complementary word lines, or boosted word lines. Many of the designs are impractical because of the penalty of greatly increased die size and circuit complexity.

Referring now to FIG. 2, a self-bootstrapping circuit 40 sometimes used in DRAM ("Dynamic Random Access Memory") and other memory applications for driving word lines to the full rail voltage. Circuit 40 has not been previously adapted for use in driving plate line segments in ferroelectric memory circuits. Circuit 40 includes a first NMOS transistor 32 having a first current node coupled to a low voltage word line enable signal WLEN at node 36, a gate coupled to a source of supply voltage (the rail voltage), and a second current node labeled WL'. A second NMOS transistor 34 has a first current node coupled to the word line WL at node 39, a second current node coupled to a word clock line WLCLK at node 38, and a gate coupled to the second current node WL' of the first NMOS transistor 32.

What is desired is a segmented plate line ferroelectric memory array having NMOS-only, layout-compact plate line segment drivers that will impress the full PLCLK voltage on each plate line segment, driving the segment to the full available Vdd rail voltage.

SUMMARY OF THE INVENTION

It is, therefore, a principal object of the present invention to present a nonvolatile ferroelectric memory array having segmented plate lines wherein the full available rail voltage is impressed on each of the accessed plate line segments.

It is another object of the invention to provide a plate line driver circuit that is easily integrated into a segmented plate line memory array layout.

It is an advantage of the invention that the plate line driver circuit of the present invention can be designed to have about the same layout pitch as a row of ferroelectric memory cells.

It is another advantage of the invention that the plate line driver circuit does not materially increase the die size of the integrated memory circuit.

It is another advantage of the invention that the plate line driver circuit does not use P-channel transistors or complementary word lines.

It is another advantage of the invention is that it is self-bootstrapping and therefore an additional external voltage or charge pump is not required.

According to the present invention a ferroelectric nonvolatile random access memory array includes multiple ferroelectric memory cells arranged in rows and columns, a word line coupled to a word line input of each of the ferroelectric memory cells in a row, and a bit line coupled to a bit line input of each of the ferroelectric memory cells in a column. The memory array also includes multiple plate lines, with each plate line being arranged into a plurality of plate line segments each coupled to a plate line input of a predetermined number of the ferroelectric memory cells in a row, and multiple NMOS plate line segment drivers coupled to each of the plate line segments for selectively driving the corresponding plate line segment to a full rail voltage. The rows of ferroelectric memory cells and the NMOS plate line segment drivers have substantially the same layout pitch, and the NMOS plate line segment drivers are embedded within a corresponding single row of ferroelectric memory cells. The plate line segment drivers are each coupled to a center portion of the corresponding plate line segment, wherein half of the predetermined number of the memory cells are coupled to a first portion of the plate line segment and the other half of the memory cells are coupled to a second portion of the plate line segment. The center coupling optimizes performance with resistive plate lines, such as noble metal plate lines, which are typically used with ferroelectric dielectric materials.

Each of the NMOS plate line segment drivers includes a first NMOS transistor having a first current node coupled to the word line associated with the ferroelectric memory cells coupled to the plate line segment, a gate coupled to a source of supply voltage, and a second current node, and a second NMOS transistor having a first current node coupled to the plate line segment, a second current node coupled to a plate clock line, and a gate coupled to the second current node of the first NMOS transistor. The two transistors operate together in a self-bootstrapping manner to ensure that the full plate clock line voltage, which is typically equal to the available external power supply voltage is applied to the plate line segments and, therefore, the ferroelectric memory cells coupled to the plate line segments.

The foregoing and other objects, features and advantages of the invention will become more readily apparent from the following detailed description of a preferred embodiment of the invention which proceeds with reference to the accompanying drawings.

DETAILED DESCRIPTION

Figure 1:
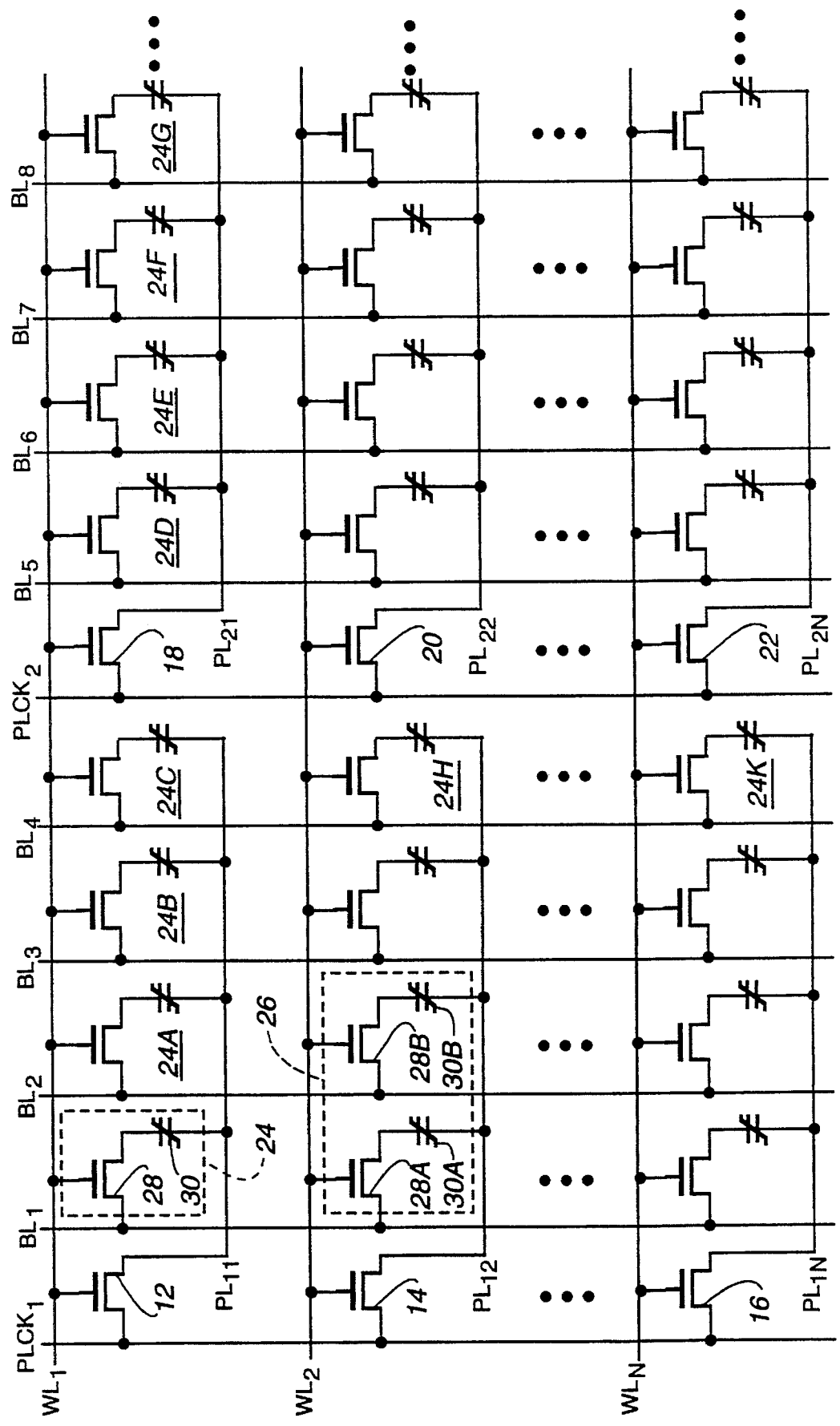
FIG. 1 is a schematic diagram of a prior an nonvolatile ferroelectric memory array including segmented plate lines with single transistor plate line driver circuits.
Figure 2:
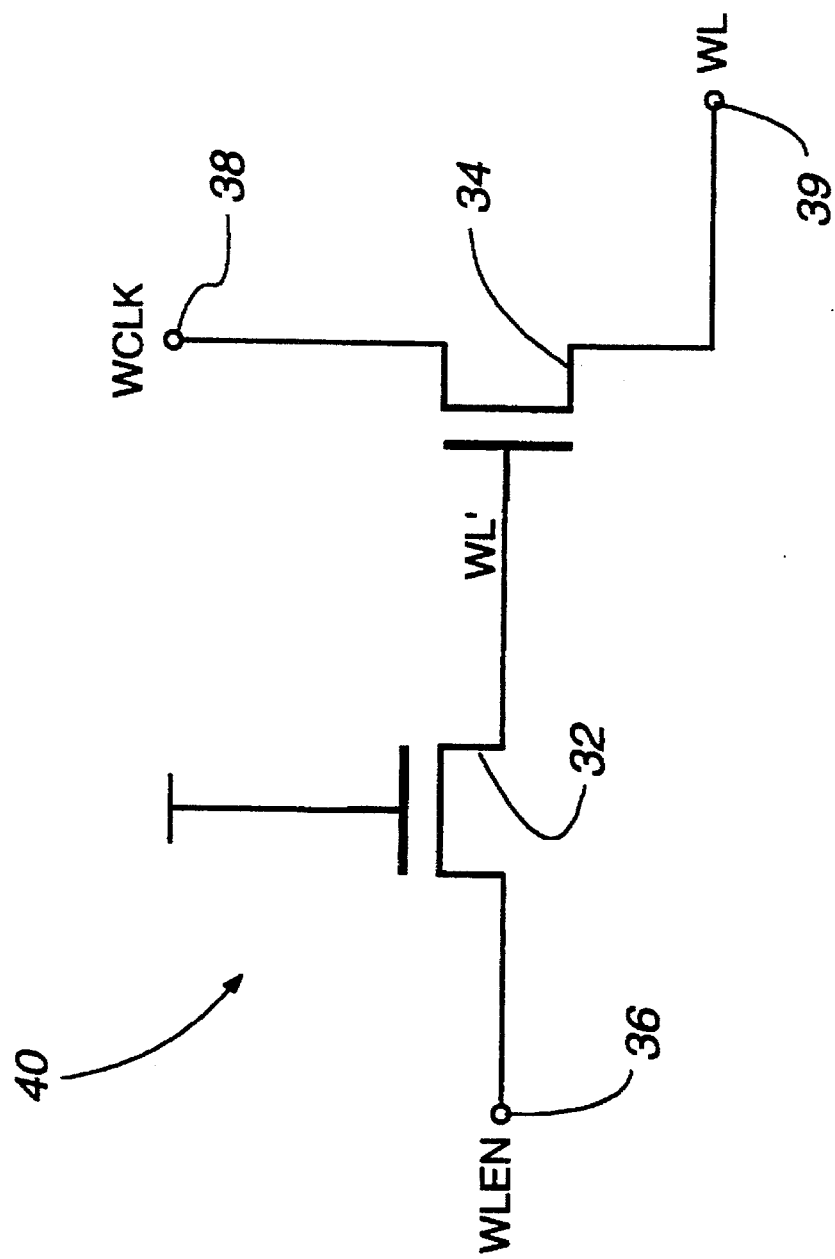
FIG. 2 is a schematic diagram of a prior art circuit used in DRAM applications to drive word lines to the full rail voltage.
Figure 3:
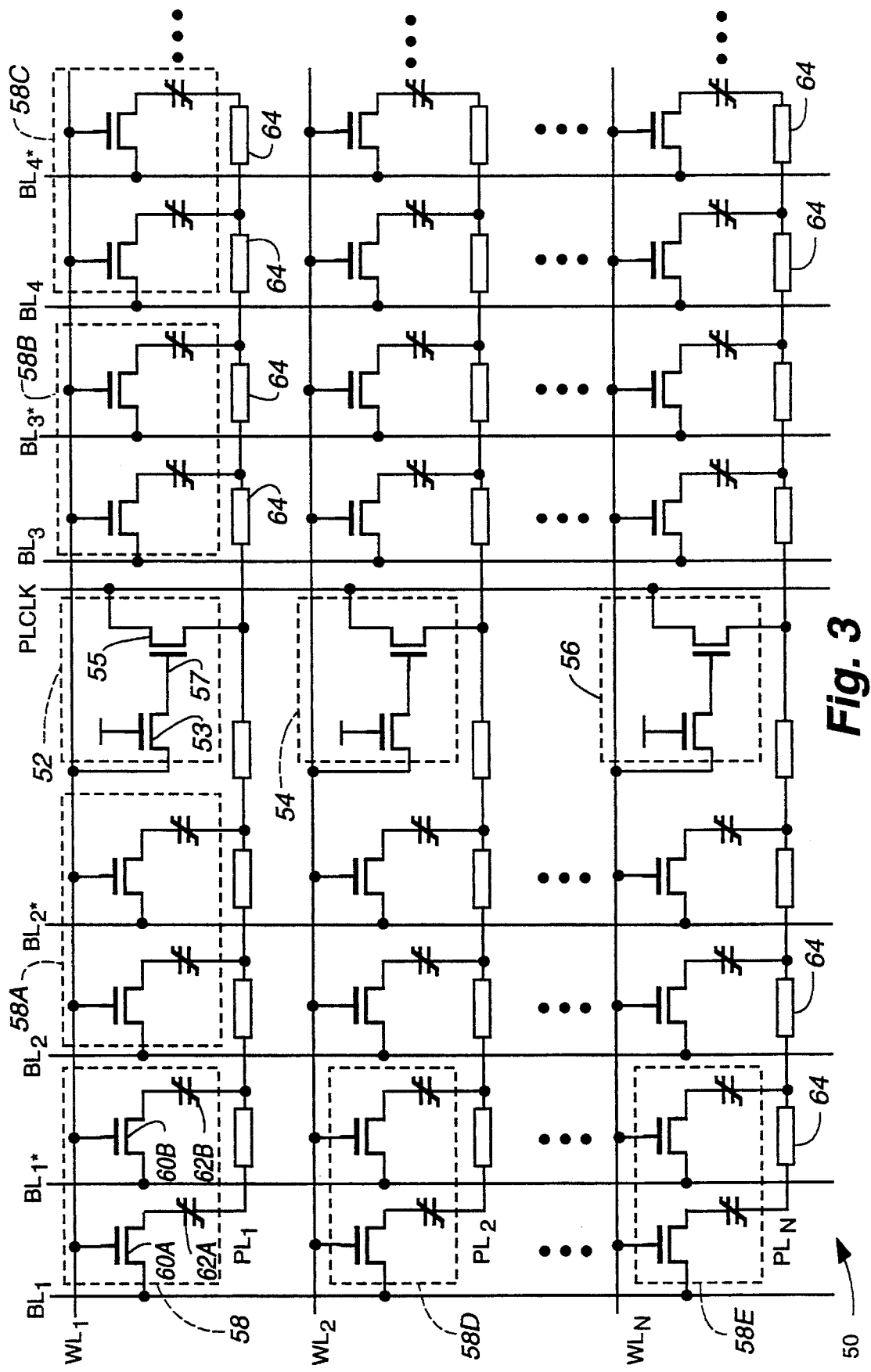
FIG. 3 is a schematic diagram of a nonvolatile ferroelectric memory array of two transistor, two capacitor memory cells including segmented plate lines with plate line driver circuits according to the present invention.

Referring now to FIG. 3, a ferroelectric nonvolatile random access memory array 50 includes multiple two transistor, two capacitor ferroelectric memory cells such as memory cell 58 arranged in rows and columns, a word line WL coupled to a word line input of each of the ferroelectric memory cells such as cells 58–58C in a row, and a complementary bit line coupled to the bit line inputs of each of the ferroelectric memory cells such as cells 58–58E in a column. Multiple plate lines are coupled to the plate line input of each of the ferroelectric memory cells such as cells 58–58C in a row. Each plate line is arranged into multiple plate line segments PL, which are in turn coupled to a plate line input of a predetermined number of the ferroelectric memory cells such as cells 58–58C in the row. Multiple NMOS plate line segment drivers 52 are coupled to each of the plate line segments PL for selectively driving the corresponding plate line segment PL to a full rail voltage, such as the available Vdd power supply voltage, which is typically 5.0 or 3.3 volts.

A typical two transistor, two capacitor memory cell such as representative cell 58 is shown in FIG. 3 having two access transistors 60A and 60B serially coupled to two ferroelectric capacitors 62A and 62B. The word line for the row containing memory cell 58 is designated $WL_1$ and is coupled to the word line input for the cell, which is coupled to the gate nodes of transistors 60A and 60B. The complementary bit line for the column containing memory cell 58 is designated $BL_1$ and $BL_{1*}$ and is coupled to the bit line inputs for the cell, which is respectively coupled to the first current node of transistors 60A and 60B. For clarity in FIG. 3, only portions of three plate lines are shown. The portion shown in FIG. 3 is actually a single plate line segment coupled to the plate line inputs of four two transistor, two capacitor memory cells. For example, plate line segment $PL_1$ is coupled to the plate inputs of memory cells 58–58C. The plate line input for memory cell 58 is coupled to the "bottom" plate electrodes of ferroelectric capacitors 62A and 62B. While only one plate line segment per row is shown in FIG. 3, any number can be used. Further, while only four memory cells are shown coupled to the plate line segments, any number of memory cells can be coupled thereto.

In FIG. 3, multiple NMOS plate line segment drivers are shown, one corresponding to each of the plate line segments in the memory array 50. Each NMOS plate line segment driver includes a first NMOS transistor 53 having a first current node coupled to the word line associated with the ferroelectric memory cells coupled to the plate line segment, a gate coupled to a source of supply voltage Vdd, and a second current node. A second NMOS transistor 55 has a first current node coupled to the plate line segment, a second current node coupled to a plate clock line, and a gate coupled to the second current node of the first NMOS transistor 53. Representative NMOS plate line segment drivers 52, 54, and 56 are shown respectively coupled to plate line segments $PL_1$, $PL_2$, and $PL_N$. Each plate line segment driver includes a word line input coupled to the word line associated with the ferroelectric memory cells coupled to the plate line segment and a clock line input coupled to a plate clock line. For example, plate line segment driver 52 includes a word line input (first current node of transistor 53) coupled to the word line WL1, which is associated with ferroelectric memory cells 58–58C coupled to plate line segment $PL_1$. Plate line segment driver 52 also has a clock line input (second current node of transistor 55) coupled to a plate clock line designated PLCLK. The operation of the plate line segment drivers is described in further detail below, especially with reference to the timing diagram of FIG. 6.

In the memory array 50 of FIG. 3, plate line segment drivers 52, 54, and 56 are coupled to an intermediate portion of the corresponding plate line segments $PL_1$, $PL_2$, and $PL_N$. Some of the memory cells are coupled to a first portion of the plate line segment and the remaining memory cells are coupled to a second portion of the plate line segment. Ideally, the plate line segment drivers are coupled to a center portion of the corresponding plate line segment, wherein substantially half of the memory cells are coupled to a first portion of the plate line segment and the the other half of the memory cells are coupled to a second portion of the plate line segment. For example, in FIG. 3, memory cells 58 and 58A are coupled to a first portion of the plate line segment $PL_1$, and memory cells 58B and 58C are coupled to a second portion of plate line segment $PL_1$. Plate line segment driver 52 is centrally coupled to plate line segment $PL_1$, i.e. the first current node of transistor 55 is coupled to a central point along the plate line segment $PL_1$.

The reason that there is a central coupling of the plate line segment driver to the plate line segment is that for ferroelectric memory cells, the plate line is typically a resistive material having a sheet resistivity of between one and five ohms per square. The central coupling of the plate line segment driver minimizes the amount of resistance between the driver and any given memory cell in the array. In FIG. 3, the plate line segments are therefore shown as multiple serially coupled resistors 64. If lead zirconate titanate ("PZT") is used for the ferroelectric material in the memory cells, the plate line is typically fabricated from platinum having a thickness of between 1000 and 3000 Angstroms. Typically an additional titanium layer is used as an adhesion layer.

There are two separate operations involved with the NMOS plate line segment drivers in order to drive the plate line segment to the full rail voltage, Vdd. These two operations should be analyzed separately in time, consistent with the speed goals of the overall memory circuit.

Referring now to representative plate line segment driver 52 shown in FIG. 3, the initial operation involves driving the intermediate node 57 to Vdd–$V_{TN1}$, wherein $V_{TN1}$ is the threshold to voltage of transistor 53. The gate width of transistor 53 is sized considering the time constraints of charging the gate of transistor 55 to Vdd–$V_{TN1}$. The capacitance of the gate node of transistor 55, which consists of gate oxide capacitance and gate-to-drain overlap capacitance, is calculated based on the width and length of the gate of transistor 55, along with the unit values associated with the specific process being utilized. This calculated capacitance will dictate the gate width of transistor 55 based on the current drive capability of the process, taking into account variations in processing, as well as the voltage range and temperature range of operation for the overall memory circuit. Typically, the process minimum gate length is used for transistor 53 since this will result in maximum current drive for the smallest area consumed by the device. Area consumption is very important since the layout of plate line segment driver 52 should ideally mate up to one side of the memory cell as layed out, i.e. it should ideally fit "in pitch." In other words, the rows of ferroelectric memory cells and the NMOS plate line segment drivers have substantially the same layout pitch, the NMOS plate line segment drivers being embedded within a corresponding single row of ferroelectric memory cells. The layout of the plate line segment drivers is described in further detail below, especially with reference to the layout shown in FIG. 5A.

The time constraints associated with driving intermediate node 57 to Vdd–$V_{TN1}$ are based on the wordline voltage rising from a logic zero level to a logic one level, and the amount of time required, once the wordline has fully reached the logic one level, for transistor 53 to charge the gate of transistor 55 to Vdd–$V_{TN1}$. The threshold voltage $V_{TN1}$ of transistor 53 is "body effected" due to the bulk-to-source voltage VBS being equal to Vdd–Vtn, and not the ideal of zero volts, so this fact should be considered when calculating the starting voltage of intermediate node 57 prior to the bootstrapping of this node.

In equation form, if transistor 53 has a corresponding threshold voltage of $V_{TN1}$ volts, the value of the supply voltage is Vdd volts, and the transistor 55 has a corresponding threshold voltage of $V_{TN2}$ volts, then $V_{TN1}$, $V_{TN2}$, and Vdd should be related according to the equation:

$$Vdd - V_{TN1} > V_{TN2} \qquad [1]$$

so that transistor 55 is turned on and the self-bootstrapping action of node 57 can begin, as is explained in further detail below. If transistors 53 and 57 each have roughly the same threshold voltage of about $V_{TN}$ volts, and the value of the supply voltage is Vdd volts, then $V_{TN}$ and Vdd are related according to the following equation:

$$Vdd > 2V_{TN}. \qquad [2]$$

Once the gate of transistor 55 is fully charged to Vdd–Vtn, the PLCLK signal, which is connected to the drain (a current node) of transistor 55, may now be driven from a logic zero level to a logic one level. The transition of the PLCLK signal is the second distinct operation that is necessary to drive the plate line segment to the full Vdd rail voltage. Since the gate-to-source voltage Vgs of transistor 55 is above $V_{TN2}$ (assuming Vdd–$V_{TN1}$>$V_{TN2}$), the channel formed in transistor 55 will result in the capacitive coupling of the entire gate area, or W×L, times the unit gate oxide capacitance, or $C_{OX}$, into the intermediate node 57, which is the gate node of transistor 55. The total coupling capacitance is designated C. The amount of boost in voltage ΔV to node 57 is a function of the ratio of this coupling capacitance to the parasitic capacitance Cp of the node, i.e:

$$\Delta V = Vdd \times (C/(C+Cp)). \quad [3]$$

The parasitic capacitance Cp consists of interconnect parallel plate capacitance, interconnect fringing capacitance, and the gate-to-drain overlap capacitance of transistor 53. The bootstrapping efficiency is the ratio of the coupling capacitance C to the sum of the coupling capacitance and the parasitic capacitance, (C+Cp). To improve the efficiency, three separate considerations should be addressed. First, the layout should be done in such a manner as to minimize the interconnect parasitic capacitance, both parallel plate and fringing. Secondly, the gate area of transistor 55 should be considered as this determines the coupling term. Thirdly, the gate width W of transistor 53 should be considered as this determines the gate-to-drain overlap capacitance term. The final voltage of the gate of transistor 55 should be greater than Vdd+$V_{TN2}$ to ensure that transistor 55 can drive the plate line segment fully to a logic one level. Therefore, the potential of the gate of transistor 55 before boosting (Vdd–$V_{TN1}$), plus the product of the bootstrapping efficiency and the voltage swing of PLCLK (Vdd), should ideally be greater than Vdd+$V_{TN2}$ in order to drive the plate line segment to Vdd. Also, it is desirable to have roughly 500 mV of additional margin to ensure that transistor 55 is not approaching turnoff (i.e., Vgs is not approaching VTN) as the plate line segment nears Vdd. Therefore transistor 55 will still be able to source current as the plate line segment attains the Vdd potential. If the voltage at node 57 of transistor 55 is designated $V_{PL'}$, the value of the supply voltage is Vdd volts, and transistor 55 has a corresponding threshold voltage of $V_{TN2}$ volts, then $V_{PL}'$, Vdd, and $V_{TN2}$ are related according to the equation:

$$V_{PL}' \geq Vdd + V_{TN2} + 0.5 \text{ volts}. \quad [4]$$

The W/L ratio of transistor 55 should be considered with respect to the distributed capacitance and resistance of the plate line segment being driven. Typically a process minimum gate length is chosen for transistor 55, similar to transistor 53, to ensure that the maximum drive is attained in the smallest area, which is critical for a pitched layout. Therefore, the timing budget of the overall memory circuit and the allotted portion thereof for driving the plate line segment should be weighed against chip size in determining the optimum gate width for transistor 55.

In order to size transistors 53 and 55, one should first consider the equivalent RC time constant of the corresponding plate line segment, in this case $PL_1$. For a two transistor, two capacitor configuration as shown in FIG. 3, each memory cell 58 connected to the plate line segment will include one ferroelectric capacitor used in the linear mode, and one ferroelectric capacitor that is switched. Ferroelectric capacitors are typically described in terms of micro-Coulombs per square centimeter. These values may be converted to an equivalent capacitance per square micron, given the voltage of operation, since C=Q/V.

The ferroelectric capacitor's Q versus v curves are non-linear in nature, but nonetheless an equivalent linear capacitance may be used to approximate the RC time constant since the voltage swing across the capacitor will be known for a given voltage of operation. Once the equivalent linear capacitance per square micron is calculated, the capacitance per ferroelectric capacitor may be calculated by determining the product of the unit capacitance and the area of the capacitor. Again, for the two transistor, two capacitor configuration shown in FIG. 3, one should consider the two capacitors 62A and 62B individually, since the equivalent linear capacitor values per square micron will be higher for the switching capacitor as compared to the linear, non-switching capacitor. Next, the resistance of the plate line segment $PL_1$ may be calculated using the inherent sheet resistance of the plate line interconnect, along with the aspect ratio of the interconnect. Then, the RC time constant for one cell 58 may be calculated as the product of the equivalent capacitance and the resistance of the plate line segment $PL_1$. In a memory array row or column, the memory cells will be placed adjacent to each other, with the total number of cells in a row or column being a power of two. Ideally, the number or cells coupled to a plate line segment will also be grouped by a number that is a power of two. Since the plate line segment is ideally driven from the center of the plate line segment, the worst case resistance will be one half of the total resistance of the plate line segment coupling all of the cells, but the total capacitance will be that of all the cells connected to the plate line segment. For example, if 32 cells are coupled to a plate line segment, the total resistance will be that of a plate line segment coupling 16 cells while the capacitance will be that of 32 cells. This is useful for a first order approximation of the rise time of the segment, since it is a distributed RC network. However, verification of the circuit performance via a circuit simulator such as SPICE is recommended. In terms of die area, one should examine the area consumed by the plate line segment driver 52 considering that it would ideally fit in the pitch of the corresponding row of memory cells. In sizing transistor 55, as is typical in driving any RC network, there will be a point of diminishing returns where adding extra device gate width will not add a significant incremental performance increase.

When a one transistor, one capacitor cell arrangement is used, as in FIG. 4, which is described in further detail below, the equivalent capacitance for the cells is data dependent, so the worst case is all memory cell capacitors in a switching mode. When using a circuit simulator such as SPICE it is desirable to use an accurate ferroelectric capacitor model that reflects the non-linear charge versus voltage response of the ferroelectric capacitor.

Typically, a ratio of 10:1 for the gate width of transistor 55 to the gate width of transistor 53 is a good starting point for the simulation. This results in a bootstrapping efficiency which should result in the gate of transistor 55 attaining a voltage which yields adequate margin. Of course, favorable layout techniques which minimize the parasitic capacitance of node 57, as described above, will ensure that the circuit transfers the full rail voltage to the plate line segment. Also, for 3 volt operation, which may translate into a minimum Vdd of 2.7 volts, the process should feature a body effected $V_{TN}$ of less than 50% of the minimum Vdd voltage. A lower body effected $V_{TN}$ for the process utilized will yield more margin for the circuit to meet the voltage level and speed goals for the overall circuit.

Figure 4:
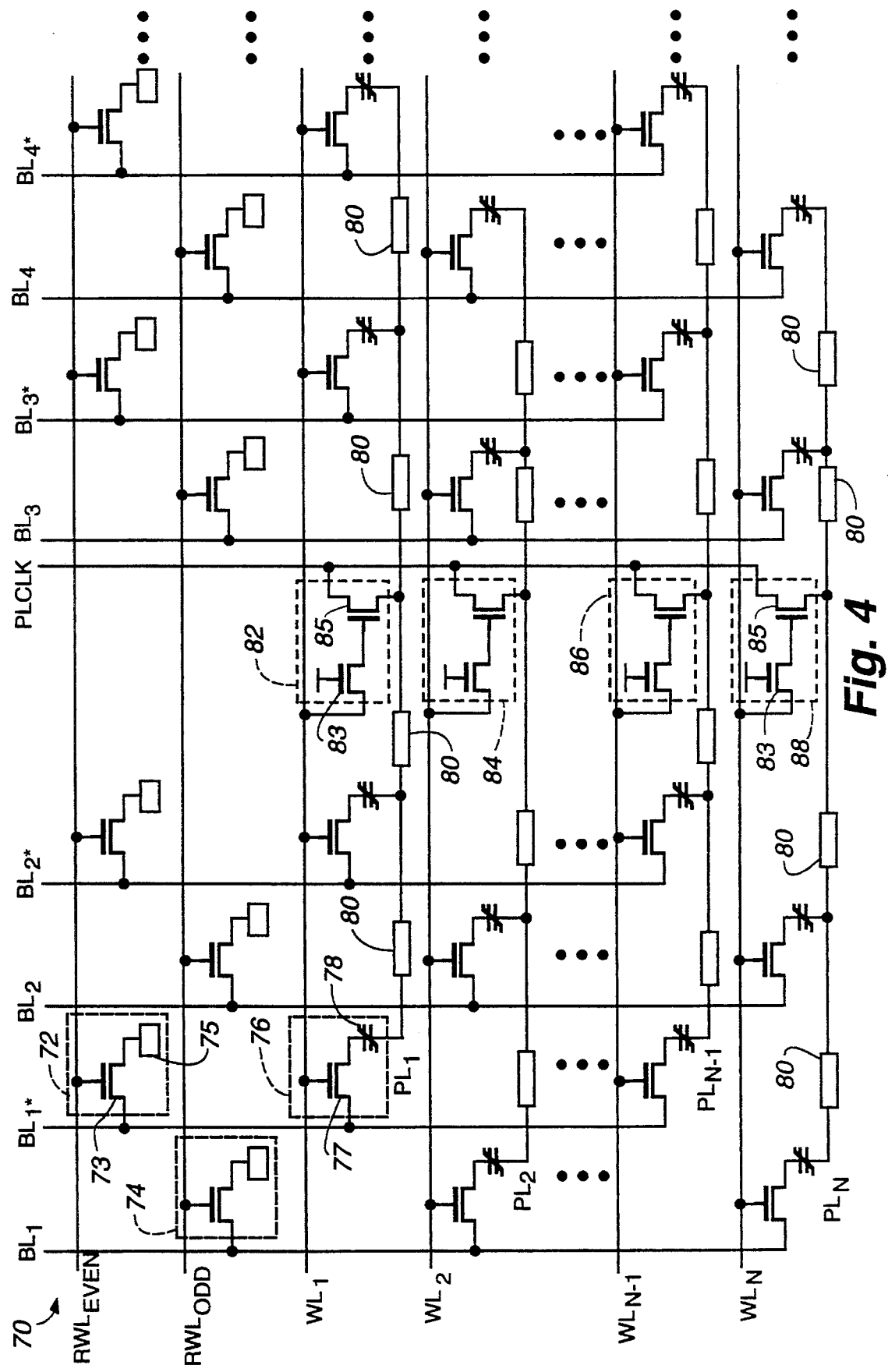
FIG. 4 is a schematic diagram of a nonvolatile ferroelectric memory array of one transistor, one capacitor memory cells, and corresponding reference cells, including segmented plate lines with plate line driver circuits according to the present invention.

Turning now to FIG. 4, a ferroelectric memory array 70 of one transistor, one capacitor ferroelectric memory cells is shown, having centrally located representative plate line segment drivers 82, 84, 86, and 88 corresponding to plate line segments $PL_1$, $PL_2$, $PL_{N-1}$, and $PL_N$. Representative one transistor, one capacitor ferroelectric memory cell 76 is shown having a single access transistor 77 and a single ferroelectric capacitor 78 coupled to the plate line segment. Array 70 further includes two rows of reference cells coupled to reference word lines $RWL_{EVEN}$ and $RWL_{ODD}$. In operation, if the data contents of a memory cell such as memory cell 76 are desired to be read, an odd word line, in this case WL1, and the corresponding odd reference word line $RWL_{ODD}$ are both energized. The charge levels on bit lines BL1 and BL1* are sensed by a sense amplifier (not shown in FIG. 4). The reference cells such as reference cells 72 and 74, typically include a single pass transistor 73 and a reference generator 75. A practical implementation of reference cells 72 and 74 can actually include several transistors and ferroelectric as well as non-ferroelectric capacitors. Two reference cells can also be combined in a single circuit that provides a voltage reference for two bit lines. Further details on reference cells for one transistor, one capacitor ferroelectric memory cells are included in a copending patent application entitled "A Voltage Reference for a Ferroelectric 1T/1C Based Memory", Ser. No. 08/306, 686, which is hereby specifically incorporated by reference.

In array 70, the plate line segments are shown as resistive, wherein each plate line segment contains serially connected parasitic resistor segments 80. It should be noted that only four rows of memory cells are shown, but any number can be used. Further, only one plate line segment is shown per row, but any number can be used. Only four memory cells are shown coupled to each plate line segment, but any number of cells, ideally a number that is a power of two, can be coupled to the plate line segment. Ideally, one plate line driver circuit is used to drive the center portion of each plate line segment. For example, plate line segment driver circuit 84 is coupled to the center portion of plate line segment $PL_2$. The operation of the plate line segment drivers 82, 84, 86, and 88 is identical to that described in detail above.

Figure 5A:
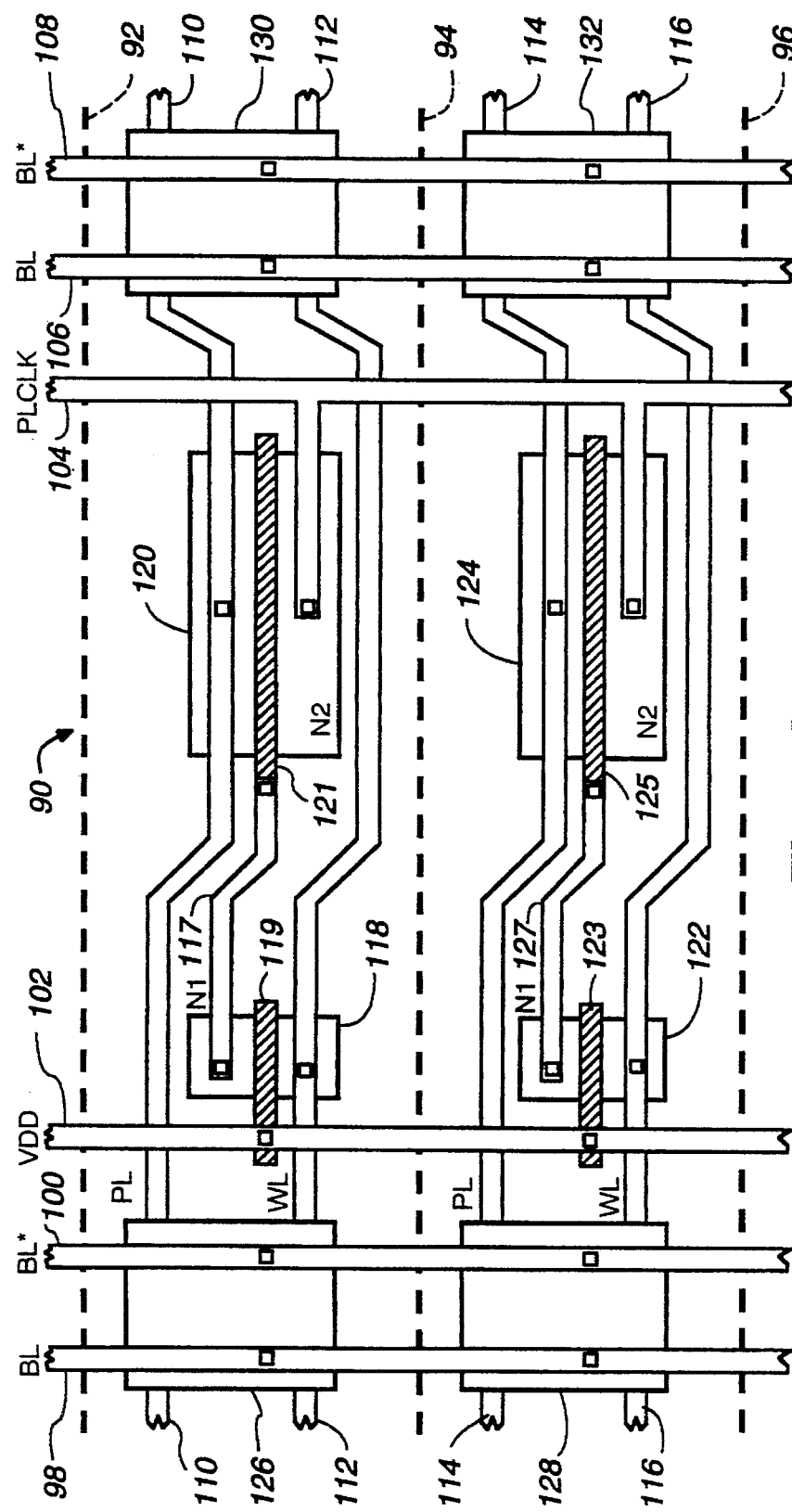
FIG. 5A is a layout diagram of a portion of a ferroelectric memory array showing the embedded plate line driver circuits according to the present invention.
Figure 5B:
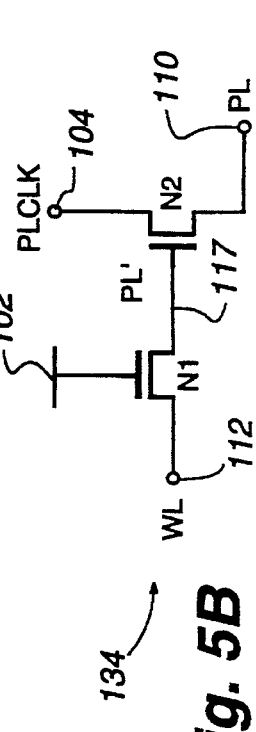
FIG. 5B is a schematic diagram of the plate line driver circuit of the present invention adapted to drive the plate line segments of a ferroelectric memory array.

A layout diagram 90 is provided in FIG. 5A corresponding to the circuit schematic for a plate line segment driver circuit 134 shown in FIG. 5B. Two partial rows of memory cells are shown, memory cells 126 and 130, and an embedded plate line segment driver including transistors N1 and N2 reside in row 93, and memory cells 128 and 132, and a corresponding embedded plate line segment driver reside in row 95. Note that the plate line segment drivers have about the same "pitch" as the memory cells, and thus can be layed out in the same row in the memory. The following busses run horizontally in the layout of FIG. 5A: plate line segments 110 and 114, each labeled PL; word lines 112 and 116, each labeled WL; the gate connections 119 and 123 for the N1 transistor in rows 93 and 95; the gate connections 121 and 125 for the N2 transistor in rows 93 and 95; and the interconnect layers 117 and 127 for coupling transistor N1 to transistor N2 in the two rows (also labeled PL') in the schematic of FIG. 5B. The following busses run vertically in the layout of FIG. 5B: bit lines 98 and 106 labeled BL; bit lines 100 and 108 labeled BL*; the Vdd buss 102; and the plate clock line bus 104 labeled PLCLK. Ideally, the plate line segment bus is fabricated out of a noble metal as described above; the other buses are typically aluminum; and the gate connections are typically polysilicon.

In sum, a ferroelectric nonvolatile random access memory array such as is shown in FIGS. 3 or 4 includes a multiple ferroelectric memory cells arranged in rows and columns, a word line coupled to a word line input of each of the ferroelectric memory cells in a row, and a bit line coupled to a bit line input of each of the ferroelectric memory cells in a column, and a plurality of plate lines. Each plate line is arranged into a number of plate line segments that are in turn each coupled to a plate line input of a number of the ferroelectric memory cells in a row. In operation, the plate line segments are selectively driven to the full rail voltage, typically 5.0, 3.3, or 3.0 volts, with an NMOS plate line segment driver. Ideally, the center portion of the plate line segment is driven with the NMOS plate line segment driver.

Figure 6:
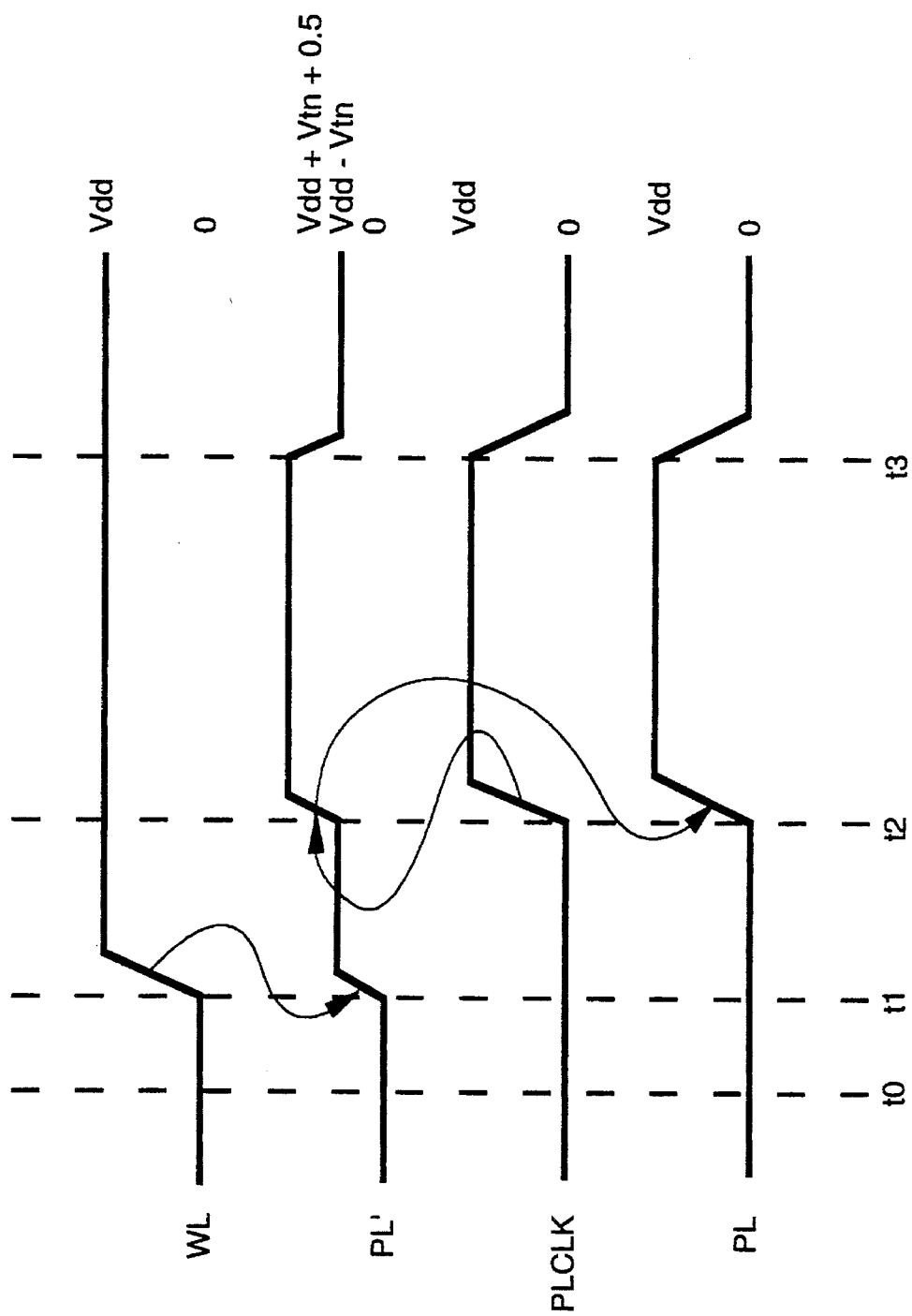
FIG. 6 is a timing diagram corresponding to various node voltages found in the memory arrays shown in FIGS. 3 and 4, and the NMOS plate line segment driver of FIG. 5B.

The operation of the ferroelectric memory cell arrays modified according to the present invention can be even better understood by a review of the timing diagram provided in FIG. 6. Four selected waveforms are shown: WL, the word line waveform; PL', the intermediate node voltage 117 shown in FIG. 5B; PLCLK, the plate clock waveform; and PL, the plate line segment waveform. At an initial time, t0, all waveforms are at a logic zero level. At time t1, the WL waveform is switched to a logic one level, which causes the PL' waveform to move to a voltage level of $Vdd-V_{TN}$ volts. At time t2, the PLCLK waveform is switched to a logic one level, which causes the PL' waveform to move to a voltage level of at least $Vdd+V_{TN}+0.5$ volts, which in turn forces the voltage on the plate line segment PL to achieve the full Vdd rail voltage. No voltage drops due to threshold voltages or any other reason appear on the plate line segment. At some subsequent time t3, the PLCLK signal is returned to a logic zero level, which returns the plate line segment voltage to a logic zero level. At some subsequent time, not shown in FIG. 6, the memory is written to, or the data restored, and the initial conditions are also restored.

Having described and illustrated the principles of the invention in a preferred embodiment thereof, it is appreciated by those having skill in the art that the invention can be modified in arrangement and detail without departing from such principles. For example, the number of rows and columns within the memory arrays can be changed as desired, the number of plate line segments per plate line can be changed as desired, and the number of memory cells coupled to each plate line segment can be changed as desired. Further, any type of nonvolatile ferroelectric memory cell can be used in addition to those illustrated herein. We therefore claim all modifications and variation coming within the spirit and scope of the following claims.

We claim:

1. A ferroelectric nonvolatile random access memory array comprising:

a plurality of ferroelectric memory cells arranged in rows and columns, a word line coupled to a word line input of each of the ferroelectric memory cells in a row, and a bit line coupled to a bit line input of each of the ferroelectric memory cells in a column;

a plurality of plate lines, each plate line being arranged into a plurality of plate line segments each coupled to a plate line input of a predetermined number of the ferroelectric memory cells in a row; and a plurality of NMOS plate line segment drivers associated with each plate line, wherein each of the plate line segment drivers is coupled to a corresponding plate line segment for selectively driving the corresponding plate line segment to a full rail voltage.

2. The memory array of claim 1 in which the rows of ferroelectric memory cells and the NMOS plate line segment drivers have substantially the same layout pitch, the NMOS plate line segment drivers being embedded within a corresponding single row of ferroelectric memory cells.

3. The memory array of claim 1 in which at least one of the plurality of NMOS plate line segment drivers further comprises:

a word line input coupled to the word line associated with the ferroelectric memory cells coupled to the plate line segment; and a clock line input coupled to a plate clock line.

4. The memory array of claim 1 in which at least one of the plate line segment drivers is coupled to an intermediate portion of the corresponding plate line segment, wherein some of the predetermined number of the memory cells are coupled to a first portion of the plate line segment and the remaining memory cells are coupled to a second portion of the plate line segment.

5. The memory array of claim 1 in which at least one of the plate line segment drivers is coupled to a center portion of the corresponding plate line segment, wherein substantially half of the predetermined number of the memory cells are coupled to a first portion of the plate line segment and the remaining memory cells are coupled to a second portion of the plate line segment.

6. The memory array of claim 1 in which the plate line comprises a resistive material having a sheet resistivity of between one and five ohms per square.

7. The memory array of claim 1 in which the plate line comprises platinum having a thickness of between 1000 and 3000 Angstroms.

8. The memory array of claim 1 in which the plate line comprises platinum and titanium having a thickness of between 1000 and 3000 Angstroms.

9. The memory array of claim 1 in which at least one of the plurality of NMOS plate line segment drivers comprises:

a first NMOS transistor having a first current node coupled to the word line associated with the ferroelectric memory cells coupled to the plate line segment, a gate coupled to a source of supply voltage, and a second current node; and a second NMOS transistor having a first current node coupled to the plate line segment, a second current node coupled to a plate clock line, and a gate coupled to the second current node of the first NMOS transistor.

10. The memory array of claim 9 in which the first NMOS transistor has a minimum gate length.

11. The memory array of claim 9 in which the second NMOS transistor has a minimum gate length.

12. The memory array of claim 9 in which the first NMOS transistor has a corresponding threshold voltage of $V_{TN1}$ volts, the value of the supply voltage is Vdd volts, and the second NMOS transistor has a corresponding threshold voltage of $V_{TN2}$ volts, wherein $V_{TN1}$, $V_{TN2}$, and Vdd are related according to the equation:

$$Vdd - V_{TN1} > V_{TN2}.$$

13. The memory array of claim 9 in which the first and second NMOS transistors each have a corresponding threshold voltage of about $V_{TN}$ volts, and the value of the supply voltage is Vdd volts, wherein $V_{TN}$ and Vdd are related according to the equation:

$$Vdd > 2V_{TN}.$$

14. The memory array of claim 9 in which the voltage at the second current node of the first NMOS transistor is designated $V_{PL'}$, the value of the supply voltage is Vdd volts, and the second NMOS transistor has a corresponding threshold voltage of $V_{TN2}$ volts, wherein $V_{PL'}$, Vdd, and $V_{TN2}$ are related according to the equation:

$$V_{PL'} \geq Vdd + V_{TN2} + 0.5 \text{ volts}.$$

15. The memory array of claim 1 in which the ferroelectric memory cells comprise two transistor, two capacitor memory cells.

16. The memory array of claim 1 in which the ferroelectric memory cells comprise one transistor, one capacitor memory cells, and the array further comprises at least one row of reference cells.

17. The memory array of claim 16 in which the reference cells comprise ferroelectric reference cells having at least one ferroelectric capacitor.

18. A ferroelectric nonvolatile random access memory array comprising:

a plurality of ferroelectric memory cells arranged in rows and columns, a word line coupled to a word line input of each of the ferroelectric memory cells in a row, and a bit line coupled to a bit line input of each of the ferroelectric memory cells in a column;

a plurality of plate lines, each plate line being arranged into a plurality of plate line segments each coupled to a plate line input of a predetermined number of the ferroelectric memory cells in a row; and a plurality of NMOS plate line segment drivers each comprising a first NMOS transistor having a first current node coupled to the word line associated with the ferroelectric memory cells coupled to the plate line segment, a gate coupled to a source of supply voltage, and a second current node, and a second NMOS transistor having a first current node coupled to the plate line segment, a second current node coupled to a plate clock line, and a gate coupled to the second current node of the first NMOS transistor, wherein the NMOS plate line segment drivers are coupled to a center portion of the corresponding plate line segment, and wherein substantially half of the predetermined number of the memory cells are coupled to a first portion of the plate line segment and the remaining memory cells are coupled to a second portion of the plate line segment for selectively driving the corresponding plate line segment to a full rail voltage, and wherein the rows of ferroelectric memory cells and the NMOS plate line segment drivers have substantially the same layout pitch, the NMOS plate line segment drivers being embedded within a corresponding single row of ferroelectric memory cells.

19. In a ferroelectric nonvolatile random access memory array including a plurality of ferroelectric memory cells arranged in rows and columns, a word line coupled to a word line input of each of the ferroelectric memory cells in a row, and a bit line coupled to a bit line input of each of the ferroelectric memory cells in a column, and a plurality of plate lines, each plate line arranged into a plurality of plate line segments each coupled to a plate line input of a predetermined number of the ferroelectric memory cells in a row, a method of the memory array, the method comprising the step of selectively driving each plate line segment to a full rail voltage with a corresponding NMOS plate line segment driver.

20. The method of claim 19 further comprising the step of driving a center portion of the plate line segment with the NMOS plate line segment driver.

* * * * *